Sept. 20, 1966 F. STERZER 3,274,459

LOW IMPEDANCE COUPLED TRANSMISSION LINE AND SOLID STATE TUNNEL DIODE STRUCTURE

Filed May 7, 1964

INVENTOR,
FRED STERZER.

BY: Harry M. Saragovitz, Edward J. Kelly, Herbert Berl & Julian C. Keppler
ATTORNEYS.

United States Patent Office 3,274,459

Patented Sept. 20, 1966

3,274,459

LOW IMPEDANCE COUPLED TRANSMISSION LINE AND SOLID STATE TUNNEL DIODE STRUCTURE

Fred Sterzer, Princeton, N.J., assignor to the United States of America as represented by the Secretary of the Army Filed May 7, 1964, Ser. No. 365,847
5 Claims. (Cl. 317—234)

This invention relates to a novel structure for solid state diodes and particularly to such diodes capable of tunnel diode operation.

The tunnel diode has found many applications wherein its unique characteristics are particularly valuable. In many of such uses microwave energy is involved and for most effective operation of the devices the inductance values of the diode itself and its connection to the circuit involved must be reduced to the lowest possible minimum. The present invention greatly reduces inductance values in such devices and also minimizes parasitic reactances due to discontinuities between the diode and its external connections.

In contrast to the above set forth advances in the art realized by the invention, prior devices such as the so-called ceramic pill type diodes, which are the best examples of the prior art, exhibit inductances as much as double that of the measured inductance value of the diode of the invention. This low inductance is of great value in many applications of the tunnel diode and particularly where such diodes are used as high power oscillators or amplifiers.

To obtain the desired characteristics, the diodes are used in connection with stripline transmission systems sometimes known as microstrip transmission. This type of transmission may be made to have a very small thickness dimension and since the diode height is very small it may be received completely within the boundaries of the stripline itself as will appear hereinafter. By so doing, the inductance of the assembly and its parasitic reactances are greatly reduced.

It is a primary object of the invention to provide a novel tunnel assembly capable of operation at high power in the microwave region with optimum efficiency and stability.

A further object of the invention is to provide a tunnel diode having a physical structure presenting greatly reduced inductance to microwave energy.

A further object of the invention is to provide a tunnel diode including a stripline transmission system wherein the coupling between the diode and the stripline presents no electrical discontinuities.

A still further object of the invention is to provide a tunnel diode assembly having a rigid physical structure which prevents changes in electrical transmission characteristics and thus provides complete electrical stability under adverse environmental conditions.

A still further object of the invention is to provide a tunnel diode whose electrical characteristics are exceptionally stable and may be held consistent throughout the manufacturing technique whereby replacement of the diode may be made without seriously changing a critically balanced circuit assembly, such as an oscillator amplifier.

Other objects and features of the invention will more fully appear from the following detailed description and will be particularly pointed out in the appended claims.

To provide a better understanding of the invention, a particular embodiment thereof will be described and illustrated in the accompanying drawings wherein.

There are various systems for conveying high frequency energy. In the present invention, the stripline transmission system is used for the reason that it insures low loss characteristics and moreover an important characteristic with respect to the present invention is its low inductance at microwave frequencies. A stripline conductor is composed of a pair of thin conducting layers insulated from each other by a very thin strip of insulation. Usually one of the conductive layers is called a ground plane conductor and the other the conductor strip. Not only may such stripline construction be made to possess very uniform electrical characteristics but may be made extremely thin. Many such conductors have a total thickness of only .002 to .005 inch. The insulation may be of high quality dielectric material such as Saran or Teflon which may be .001 inch in thickness and have metallic coatings on both sides which may be only a few microns thick. This small thickness dimension is made use of in greatly reducing the inductance of the interconnections of the active elements of a tunnel diode to its external operational components.

The present diode assembly or package as it is sometimes called is particularly effective when operated at high power values and at microwave frequencies such as the L-band. As peak diode current is approached inductance becomes of great significance and should be reduced as much as possible. The structure of the invention reduces inductance far below that of prior tunnel diode packages.

Figure 1:
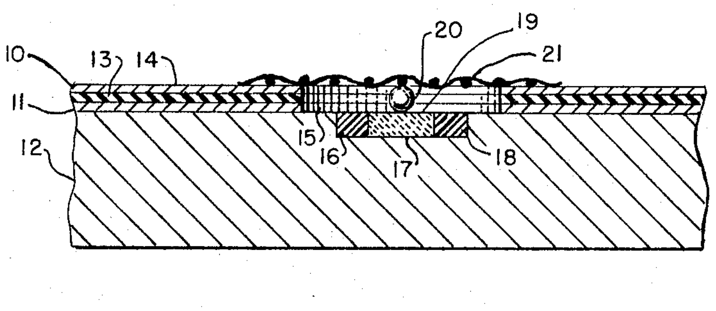
FIG. 1 is a sectional view of the assembly of the invention.
Figure 2:
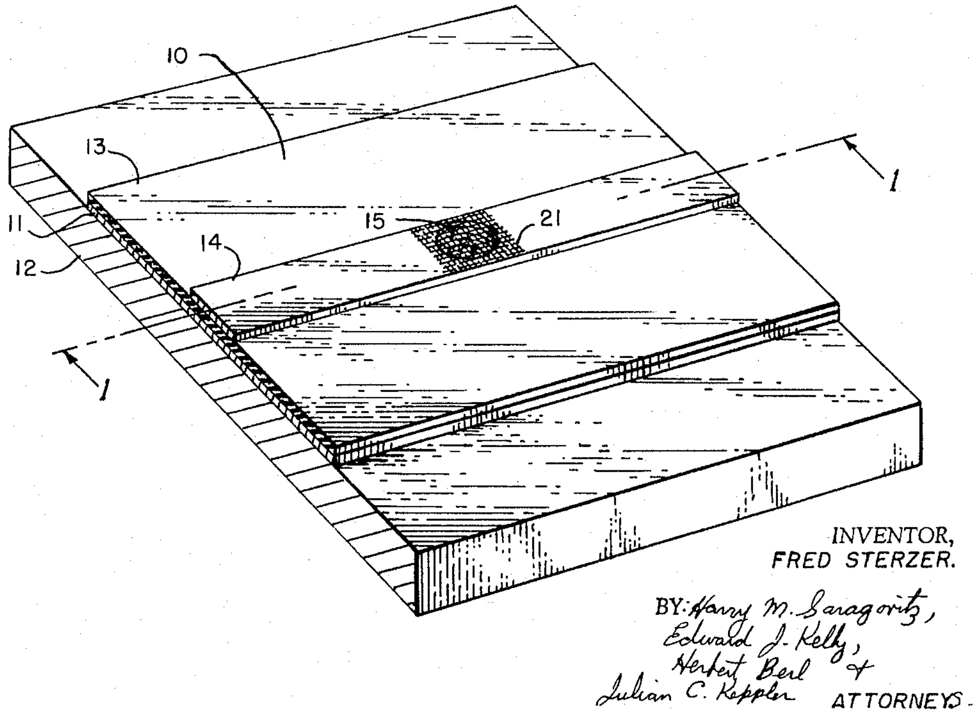
FIG. 2 is a perspective view showing the external appearance of the assembly.

FIG. 1 of the drawings illustrates a typical diode package embodying the invention and wherein the diode is fabricated integrally with the stripline 10 which is composed of a ground plane conductor 11 secured to a rigid base 12 of conductive material such as brass by conducting epoxy, solder or other suitable material. The base block 12 may serve as ground conductor for not only the diode but for other associated components which may be included in a circuit such as an amplifier or oscillator. A layer of dielectric insulation 13 is cemented upon the layer 11 and upon the insulation 13 is cemented a metallic conductor strip 14. The conductor strip 14 constitutes a portion of a circuit not shown and is substantially less in width than the ground plane conductor 11 or the base plate 12.

As explained above the layers 11, 13 and 14 are very thin and their combined thickness may be in the range of .002 inch to .005 inch. A small hole is cut through the three layers of the stripline to form a recess 15 which bares the surface of the base member 12. A second recess 16 is formed in the base 12 registering with the recess 15. A semiconductor pellet 17 is secured in the recess 16 with a low impedance nonrectifying connection such as by solder 18. The semiconductor crystal 17 is provided with a flat upper face 19 which is positioned substantially in the plane of the upper face of the block 12. The semiconductor may be of any suitable material such as gallium arsenide or germanium and should for best operation be prepared with a free charge carrier concentration several orders of magnitude higher than that used in conventional diodes.

It should be noted that the dimensions of the parts of the tunnel diode as shown in the drawings are greatly exaggerated.

The base plate 12 and the semiconductor 17 constitute the base connection for the diode. To form the diode junction a small "dot" 20 of zinc composition is placed in the recess 15 in contact with the top surface 19 of the semiconductor and at the contact point the tunnel diode junction is formed therebetween in a conventional alloying operation. To complete the electrical connection to the stripline element 14 a small section of thin wire mesh 21 is soldered to the element 14 around the edges of the recess 15 and soldered to the upper portion of the dot 20 to provide a low resistance ohmic connection thereto.

It will be noted that in the structure above set forth the diode fits directly into a very low impedance stripline transmission line wherein parasitic reactances are greatly minimized due to absence of discontinuities at points of connection between the diode and the external conductors.

The structure of the stripline at the location of the diode presents no discontinuity since the wire mesh 21 or other conducting means provide a low impedance path across the recess 15 thus avoiding a discontinuity at that point. Also the conducting base 12 provides a complete low impedance path directly to the crystal and hence to the junction of the diode and this latter path lies entirely upon the plane occupied by the ground plane member 11. It will be apparent in view of the above description that the reduced height dimension of the diode is an important factor in reducing inductance to a significantly low value which permits operation of the diode in the microwave spectrum and at high power outputs. Power outputs of 24 to 28 milliwatts at 1700 mc. were obtained from diodes having 500 milliamperes output capability.

What is claimed is:

1. A voltage controlled negative resistance solid state diode assembly comprising an electrically conductive base plate having thickness sufficient to impart rigidity to the assembly and having at least one flat surface, a stripline transmission line composed of two thin layers of conducting material separated by a thin dielectric layer, one layer being a ground plane conductor and the other a conductor strip, said ground plane conductor being electrically surface united to the flat surface of said base plate, a chamber formed in said base plate opening toward said stripline, a semicondurtor crystal having a high concentration of free charge carriers and secured in said chamber with a nonrectifying low impedance union said crystal having its top surface substantially in the plane of the flat surface of said base plate, a second chamber above and communicating with the first chamber and formed by cutting an aperture through said stripline, a small pellet of conductive material no longer than the thickness of said stripline in said second chamber engaging said crystal, a tunnel diode junction at the contact point between the crystal and pellet composed of an alloy of the materials of said contact point and a bridging conductor covering said second chamber and having an ohmic connection with said pellet and the conductor strip of said stripline.

2. A voltage controlled negative resistance solid state diode assembly according to claim 1 and wherein said semiconductor crystal is gallium arsenide.

3. A voltage controlled negative resistance solid state diode assembly comprising an electrically conductive base plate having a recess therein, a semiconductive diode crystal secured in said recess, means for providing an ohmic connection between said crystal and said base plate, and crystal and said last-mentioned means filling said recess, a stripline transmission line having first and second parallel conductive strips separated by a layer of insulating material, said line being mounted on said base plate with said first strip abutting said base plate, said first strip and said insulating material having apertures provided therein which communicate with each other and with said recess, a conductive pellet in said apertures coupled by a tunnel diode junction to said crystal, and means ohmically connecting said pellet to said second strip.

4. The device according to claim 3 and wherein said means ohmically connecting said pellet to said second strip includes a thin sheet of conductive material covering an aperture wwhich is formed in said second strip and communicates with said apertures in said first strip and said insulating material, said pellet extending into all of said apertures and being substantially equal in thickness to the total thickness of said strips and said insulating material, and said thin sheet of conductive material being secured to said second strip and to the portion of said pellet opposite said junction.

5. The device according to claim 4 and wherein said sheet is constructed in the form of a wire mesh.

References Cited by the Examiner

UNITED STATES PATENTS

| | | | |
|---|---|---|---|
| 3,063,023 | 11/1962 | Dacey et al. | 317—235 |
| 3,140,452 | 7/1964 | Schmitz et al. | 317—234 |
| 3,151,004 | 9/1964 | Glicksman et al. | 317—234 |
| 3,211,922 | 10/1965 | Gregory et al. | 317—235 |

FOREIGN PATENTS

| | | |
|---|---|---|
| 1,325,187 | 3/1963 | France. |

OTHER REFERENCES

IBM Technical Bulletin "Tunnel Diode Memory Package," by Lawrence, Jr., vol. 3, No. 7, p. 29, December 1960.

JOHN W. HUCKERT, *Primary Examiner.*

J. D. CRAIG, *Assistant Examiner.*